United States Patent [19]
Watanabe

[11] Patent Number: 5,552,629
[45] Date of Patent: Sep. 3, 1996

[54] SUPERLATTICE AVALANCE PHOTODIODE

[75] Inventor: Isao Watanabe, Tokyo, Japan

[73] Assignee: NEC Corporation, Japan

[21] Appl. No.: 408,903

[22] Filed: Mar. 22, 1995

[30] Foreign Application Priority Data

Mar. 22, 1994 [JP] Japan .................................. 6-050836
Dec. 2, 1994 [JP] Japan .................................. 6-299996

[51] Int. Cl.$^6$ ..................... H01L 31/107; H01L 29/74; H01L 31/111
[52] U.S. Cl. ................................ 257/438; 257/186
[58] Field of Search .................................. 247/438, 186

[56] References Cited

U.S. PATENT DOCUMENTS

| | | | |
|---|---|---|---|
| 4,840,916 | 6/1989 | Yasuda et al. | 257/438 |
| 5,288,989 | 2/1994 | Ishaque et al. | 257/186 |

FOREIGN PATENT DOCUMENTS

| | | | |
|---|---|---|---|
| 0163546 | 5/1985 | European Pat. Off. | |
| 0549292 | 12/1992 | European Pat. Off. | |
| 2248081 | 10/1990 | Japan | 257/186 |
| 4010478 | 1/1992 | Japan | |
| 410478 | 1/1992 | Japan | H01L 31/107 |
| 4152579 | 5/1992 | Japan | H01L 31/107 |
| 4263477 | 9/1992 | Japan | |
| 5102517 | 4/1993 | Japan | H01L 31/107 |
| 5190889 | 7/1993 | Japan | |

OTHER PUBLICATIONS

"Enhancement of Electron Impact Ionization in a Superlattice: A New Avalanche Photodiode with a Large Ionization Rate Ratio"; Capasso et al; American Institute of Physics; Appl. Phys. Letter, vol. 40, Jan. 1, 1982; pp. 38–40.

"InGaAsP–InAlAs Superlattice Avalanche Photodiode"; Kagawa et al; IEEE Journal of Quantum Electronics; vol. 28, Jun. 1992; pp. 1419–1423.

"Ati InGaAs/InAlAs Superlattice Avalance Photodiode with Thin Well Width for 10 Gb/s Optical Transmission Sysems"; Nakamurah et al; IOOC–ECOC '91. 17th European Conference on Optical Communication ECOC '91. 8th International Conference on Integrated Optics and Optical Fibre Communication IOOC '91, Paris, France, 9–12 Sep. 1991, Valbonne, France, See, France, pp. 261–264, vol. 1.

Tarof et al, "Planar InP/InGaAs Avalanche Photodetectors with Partial Charge Sheet in Device Periphery", Appl. Phys. Lett. 57(7), 13 Aug., 1990, pp. 670–672.

Nakamura et al, "An InGaAs/InAlAs Superlattice Avalanche Photodiode with Thin Well Width for 10Gb/s Optical Transmission Systems", ECOC, TuC5-4, 1991, pp. 261–264.

*Primary Examiner*—Stephen Meier
*Attorney, Agent, or Firm*—Hayes, Soloway, Hennessey, Grossman & Hage, P.C.

[57] ABSTRACT

A semiconductor device according to the invention includes an electric field buffer layer, a superlattice multiplication layer and a cap layer, which are laminated. Around a mesa side surface, a round shape $p^+$ dopant to a depth below the field buffer layer, and then the cap layer is etched so that the $p^+$ region is not in contact with the cap layer. This creates a distance of several μm in-between the inner surface of the $p^+$ region and the external surface of the cap layer.

15 Claims, 10 Drawing Sheets

LIGHT

SUPERLATTICE AVALANCE PHOTODIODE

FIELD OF THE INVENTION

The present invention relates to a superlattice avalanche photodiode, especially to a mesa structure superlattice avalanche photodiode with a planar p-n junction having high liability for optical communication.

BACKGROUND OF THE INVENTION

For adapting to an optical communication system operating at high speed, high sensitivity and high reliability semiconductor light receiving devices are required to be able to operate at a wavelength of 1.3 to 1.6 μm at high speed, high gain-bandwidth (GB) product, low dark current and high reliability. On pages 38 to 40, Volume 40(1), Appl. Phys. Lett. 1982, by F. Capasso et al., an invention by which ionization rate ratio $\alpha/\beta$ is increased by using conduction band-edge discontinuity $\Delta Ec$ of superlattice for impact ionization of electrons which has been proposed. On pages 1419 to 1423, J. Quantum Electronics, Volume 28(6), 1992, by Kagawa et al., an invention by which ionization rate ratio $\alpha/\beta$ is increased by using an InGaAsP/InAlAs system of superlattice with light sensitivity in a wavelength of 1.3 to 1.6 μm for long distance optical communication has been proposed. The ionization rate ratio $\alpha/\beta$ is increased up to 5 in contrast to that up to 2 by Bulk InGaAs.

According to the superlattice structure, conduction band-edge discontinuity $\Delta Ec$ is 0.39 eV which is larger than 0.03 eV of valence band-edge discontinuity $\Delta Ev$, so that electrons have more energy than holes by band-edge discontinuity when the electrons and holes get in a well layer. That means electrons reach the threshold energy of ionization, whereby the ionization rate ratio is increased and low noise operation can be realized.

With the above mentioned avalanche photodiode, however, leakage current is generated due to the interface level between semiconductor layers (multiplication layer, field buffer layer and light absorption layer) on the side surface of a mesa structure and an SiN passivation layer, and a residual oxide layer and defects on the surface. The leakage current causes dark current to increase from 0.8 μA up to several μA in a practical multiplication factor of 10 to 20, whereby more noise is generated. The passivation boundary surface is unstable at an atmospheric temperature of 200° C. and reverse current of 100 μA, which are the general conditions reliability tests.

Nakamura et al. fabricated a superlattice APD (Avalanche Photo Diode) using a polyimide layer as a mesa passivation layer, on pages 261 to 264, TuC5-4, ECOC, 1991. In this structure, there are many interface level (more than $2 \times 10^{12} cm^{-2} eV$), on the boundary surface between the polyimide layer and semiconductor layers (multiplication layer, field buffer layer and light absorption layer) on the side surface of the mesa structure. This kind of interface level generally is caused by dangling bond on the boundary surface between semiconductor and polyimide layer, between the semiconductor native oxide layer and semiconductor, and on surface defects, etc. Generally, in the semiconductor layers depleted in reverse bias, the first dangling bond tends to be generated in a p InGaAs light absorption layer having a relatively smaller forbidden bandgap, and the last dangling bond tends to be generated in a superlattice multiplication layer including aluminum atomics which can be natural-oxidized easily. In a high electric field (500 to 600 kV/cm), μA order of surface-leakage dark current is generated based on those interface levels. As time goes on, the interface levels and surface defects are increased due to the effect of hot-carrier injection into the passivation layer, and therefore, dark current is increased. In mesa type of photodiodes in which the semiconductor depletion layer is exposed on the side surface, surface leakage current is large and becomes unstable as time goes on.

With a planar type of device, described in a Japanese Patent Publication Kokai H4-10478, $p^-$ type material having a carrier concentration of less than $10^{16} cm^{-3}$ is doped into a superlattice multiplication layer, however, it is difficult to realize this kind of doping into mixed crystal by general crystal growth method precisely.

SUMMARY OF THE INVENTION

Accordingly, an object of the invention is to provide an improved superlattice avalanche photodiode having low surface leakage dark-current.

According to a first aspect of the invention, a superlattice avalanche photodiode includes an electric field buffer layer, a superlattice multiplication layer and a cap layer, which are laminated. Around a mesa side surface, a round phase $p^+$ region is formed to have a width several μm by doping $p^+$ to below the field buffer layer, and then the cap layer is etched so that the $p^+$ region is not in contact with the cap layer. This makes distance of several μm between the inner surface of the $p^+$ region and the external surface of the cap layer. In this structure, even if depletion layer, which is extending from the p-n junction to the light absorption layer, extends laterally toward the side surface of the mesa structure, the depletion layer does not reach the side surface of the mesa structure. That means no depletion layer reaches the passivation layer because a depletion layer of the light absorption layer is protected by a non-depletion region semiconductor. A depletion layer extending from the p-n junction toward the superlattice multiplication layer extends to the boundary surface between the passivation layer and the $n^+$ cap layer (and etching stopper layer if it is used), however, electric field intensity in the lateral direction is less than 300 kV/cm because the $p^+$ region and the $n^+$ cap layer are not in contact with each other. That is, because only the semiconductor having a low electric field and a large forbidden band width is in contact with the passivation layer, and low surface leakage current flows. According to the structure of the invention, electric field intensity on a region, to which the electric field is applied, exposed on the interface of the passivation layer is remarkably reduced.

Practically, the superlattice avalanche photodiode according to the first aspect of the invention includes a first conductive type of semiconductor substrate; a first conductive type of semiconductor buffer layer provided on the semiconductor substrate; and a first conductive type of semiconductor light absorption layer provided on the semiconductor buffer layer; a first conductive type of semiconductor electric-field buffer layer formed on the semiconductor light absorption layer; a superlattice multiplication layer provided on the semiconductor electric-field buffer layer; a second conductive type of semiconductor cap layer provided on the superlattice multiplication layer; a second conductive type of semiconductor layer provided on the semiconductor cap layer; and a first conductive type of selective region selectively formed, around a photo-sensitive region, inwardly from the surface of the contact layer so as to reach at least under the electric-field buffer layer; wherein the selective region is formed so as to be separated from either the semiconductor cap layer and contact layer by etching.

According to a second aspect of the invention, a peripheral region around a cap layer has a smaller amount of an electric-field drop relative to the region just below the cap layer, so that little field edge multiplication can be realized. For reducing field drop, impurity implantation or diffusion is used. The impurity can be Fe, Ti, Co, H, 0, etc. and forms a high resistance layer by itself. If the first conductive type of field buffer layer has a thickness which is thinner at the peripheral to have a smaller amount of field drop, the superlattice multiplication layer has lower electric intensity at the peripheral relative to the center in response to the same bias voltage (area).

Practically, a superlattice avalanche photodiode according to the second aspect of the invention includes a first conductive type of semiconductor substrate; a first conductive type of semiconductor buffer layer provided on the semiconductor substrate; a first conductive type of semiconductor light absorption layer provided on the semiconductor buffer layer; a first conductive type of semiconductor electric-field buffer layer formed on the semiconductor light absorption layer; a superlattice multiplication layer provided on the semiconductor electric-field buffer layer; a second conductive type of semiconductor cap layer provided on the superlattice multiplication layer; a second conductive type of semiconductor contact layer provided on the semiconductor cap layer; and a first conductive type of selective region selectively formed, around a photo-sensitive light, inwardly from the surface of the contact layer so as to reach at least under the electric-field buffer layer; wherein the selective region is formed so as to have higher resistance selectively at a region being in contact with the semiconductor cap layer and contact layer so as to electrically isolate the cap and selective region from each other.

DESCRIPTION OF THE PREFERRED EMBODIMENTS

Figure 1:
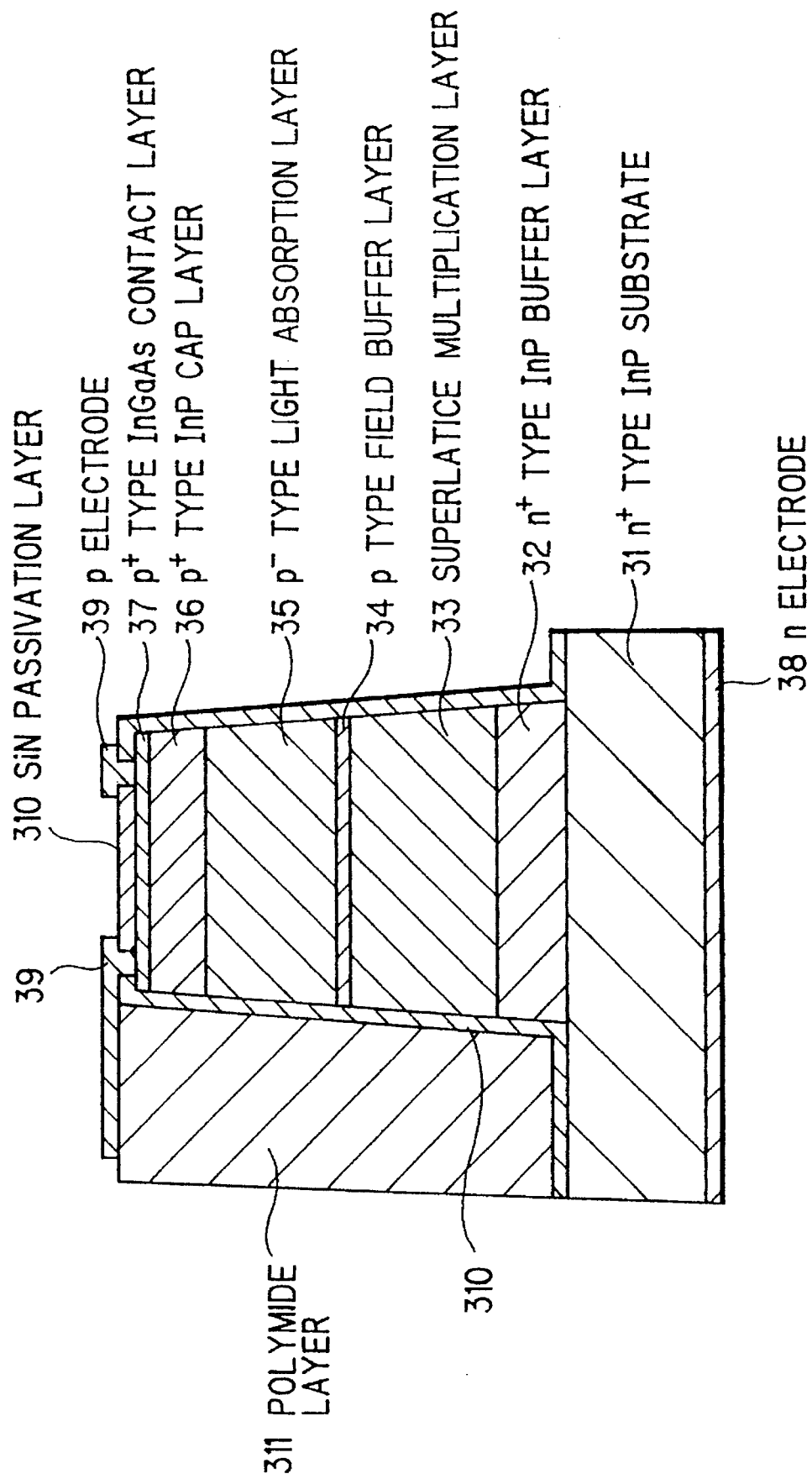
FIG. 1 is a cross-sectional view showing a first conventional semiconductor light receiving device.

For better understanding of the invention, a conventional technology is first described. FIG. 1 shows a first conventional superlattice avalanche photodiode, which includes an $n^+$ type InP substrate 31, an $n^+$ type IP buffer layer 32 provided on the InP substrate 31, an $n^-$ type InGaAsP/InAlAs superlattice multiplication layer 33 provided on the buffer layer 32, a p type InP electric-field buffer layer 34 provided on the superlattice multiplication layer 33, a $p^-$ type InGaAs light absorption layer 35 provided on the field buffer layer 34, a $p^+$ type InP cap layer 36 provided on the light absorption layer 35, a $p^+$ type InGaAs contact layer 37 provided on the cap layer 36, an n-electrode 38 provided on the reverse surface of the substrate 31, a p-electrode 39 connected to the contact layer 37, an SiN passivation layer 310 provided almost over the entire structure and a polyimide layer 311 provided on the side surface of the SiN passivation layer 310.

According to the above mentioned avalanche photodiode, as described before, however, leakage current is generated due to interface level between semiconductor layers (superlattice multiplication layer 33, field buffer layer 34 and light absorption layer 35) on the side surface of the mesa structure and the SiN passivation layer 310, and a residual oxide layer and defect on the surface. The leakage current causes dark current to increase from 0.8 up to several μA in a practical multiplication factor of 10 to 20, whereby more noise is generated. The passivation boundary surface is unstable at an atmospheric temperature of 200° C. and reverse current of 100 μA, which are general conditions for reliability tests.

Figure 2:
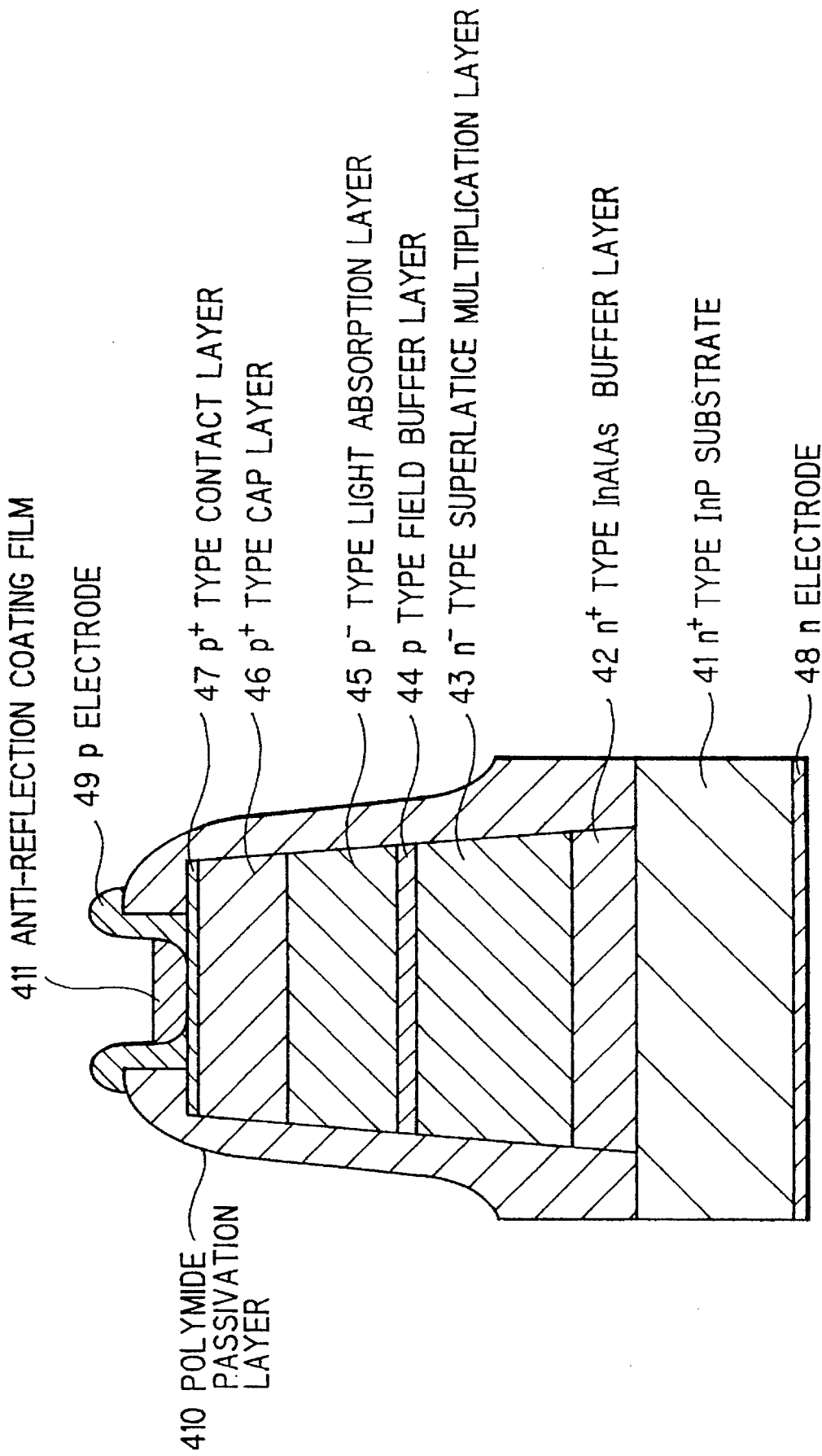
FIG. 2 is a cross-sectional view showing a second conventional semiconductor light receiving device.

FIG. 2 shows a second conventional superlattice avalanche photodiode, which includes an $n^+$ type InP substrate 41, an $n^+$ type of InAlAs buffer layer 42 provided on the InP substrate 41, an $n^-$ type InGaAs/InAlAs superlattice multiplication layer 43 provided on the buffer layer 42, a $p^-$ type InAlAs electric-field buffer layer 44 provided on the superlattice multiplication layer 43, a $p^-$ type InAlAs light absorption layer 45 provided on the field buffer layer 44, a $p^+$ type InAlAs cap layer 46 provided on the light absorption layer 45, a $p^+$ type InGaAs contact layer 47 provided on the light absorption layer 45, a $p^+$ type InGaAs contact layer 47 provided on the cap layer 46, an n-electrode 48 provided on the reverse surface of the substrate 41, a p-electrode 49 connected to the contact layer 47, a polyimide passivation layer 410 provided almost over the entire structure and a reflection preventing layer 411 provided on the contact layer 47.

According to the above mentioned avalanche photodiode, as described before, however, there are many interface level (more than $2 \times 10^{12} \text{cm}^{-2} \text{eV}$), on the boundary surface between the polyimide layer and semiconductor layers (superlattice multiplication layer 43, field buffer layer 44 and light absorption layer 45) on the side surface of the mesa structure. In a high electric field (500 to 600 kV/cm), μm order of surface-leakage dark current is generated based on those interface levels. As times goes on, the interface levels and surface defects are increased due to the effect of hot-carrier injection into the passivation layer, and therefore, dark current is increased. In mesa type photodiodes in which the semiconductor depletion layer is exposed on the side surface, surface leakage current is large and becomes unstable as times goes on.

Figure 3:
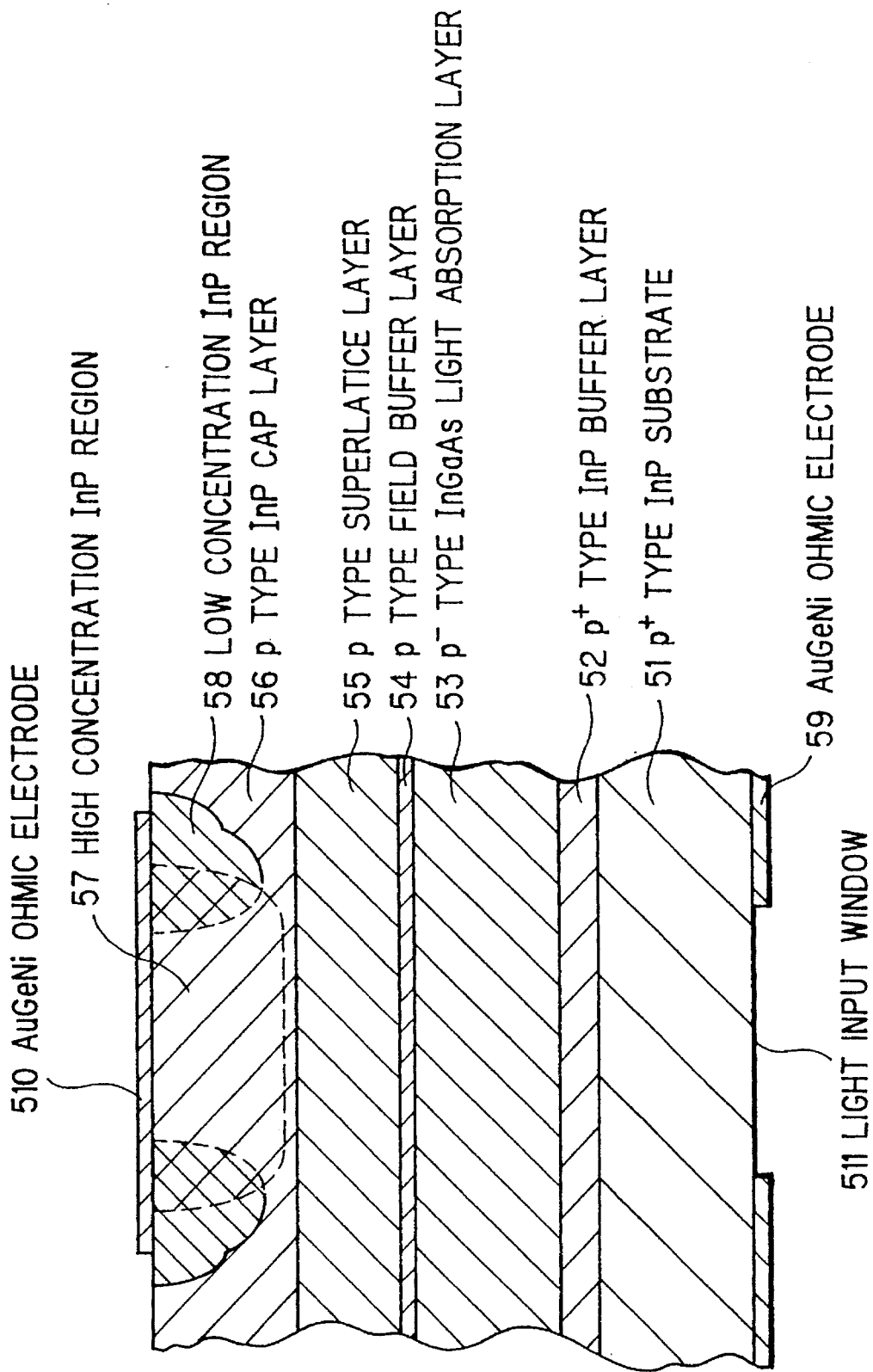
FIG. 3 is a cross-sectional view showing a third conventional semiconductor light receiving device.

FIG. 3 shows a third conventional planar type of device, which includes a $p^+$ type InP substrate 51, a $p^+$ type InP buffer layer 52 provided on the InP substrate 51, a $p^-$ type InGaAs light absorption layer provided on the buffer layer 52, a p type InGaAs electric-field buffer layer 54 provided on the light absorption layer 53, a p type InGaAs/InAlAs superlattice multiplication layer 55 provided on the field buffer layer 54, a p type InP cap layer 56 provided on the superlattice multiplication layer 55, a high concentration n type InP region 57 formed in the cap layer 56, a low concentration n type InP region 57 formed in the cap layer 56, a low, concentration n type InP region 58 formed in the cap layer 56, an AuGeNi ohmic electrode 59 provided on the reverse surface of the substrate 51 to have a light input window thereon, and an AuZnNi ohmic electrode 510 provided on the cap layer 56.

According to the above mentioned device, as described before, however, it is difficult to perform precise doping into the mixed crystal by the general crystal growth method.

Figure 4:
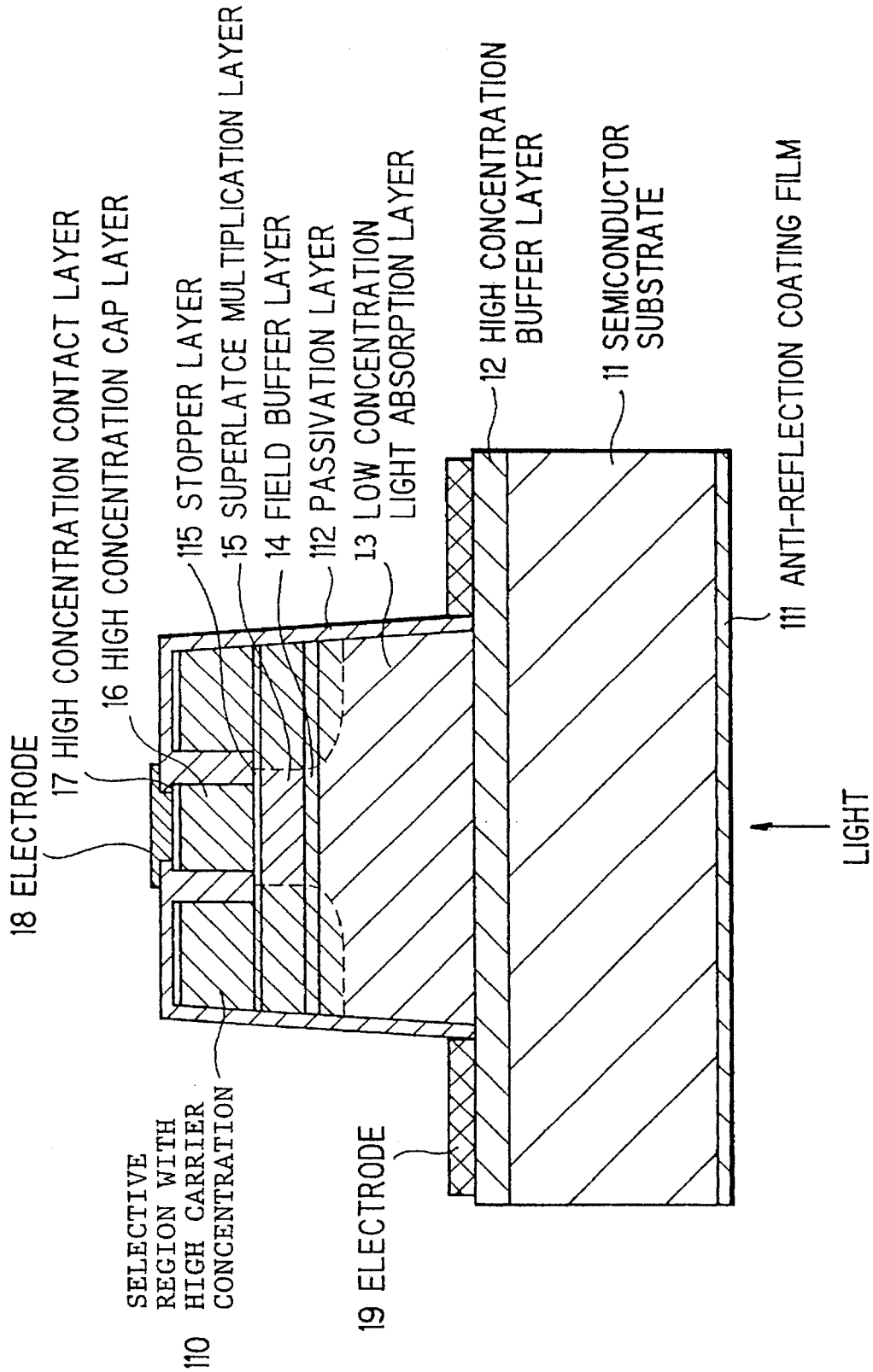
FIG. 4 is a cross-sectional view showing a semiconductor light receiving device of a first preferred embodiment according to the invention.

FIG. 4 shows a superlattice avalanche photodiode of a first preferred embodiment according to the invention, which includes a $p^+$ type InP substrate 11, a $p^+$ type InP buffer layer 12 provided on the InP substrate 11 having a thickness of 0.5 to 1.0 μm, a $p^-$ type InGaAs light absorption layer 13 provided on the buffer layer 12 and having a carrier concentration of up to $2\times10^{15} cm^{-3}$ and a thickness of 1.0 to 1.5 μm, a $p^+$ type InP electric-field buffer layer 14 provided on the light absorption layer 13 and having a carrier concentration of 0.5 to $1\times10^{18} cm^{-3}$ and a thickness of 0.1 to 0.05 μm (depending on the carrier concentration of the field buffer layer 14), a non-doped i-type or n-type InAlGaAs/InAlAs superlattice multiplication layer 15 provided on the field buffer layer 14 having a carrier concentration of up to $2\times10^{15} cm^{-3}$ and a thickness of 0.23 μm, an InP etching stopper layer 115 provided on the superlattice multiplication layer 15 and having a thickness of 0.005 to 0.05 μm, an $n^+$ type of InAlAs cap layer 16 provided on the stopper layer 115 and having a carrier concentration of up to $1\times10^{18} cm^{-3}$ and having a thickness of 0.5 μm, an $n^+$ type of InGaAs contact layer 17 provided on the cap layer 16 and having a carrier concentration of up to $1\times10^{19} cm^{-3}$ and a thickness of 0.1 μm, an n-electrode 18 of AuGeNi connected to the contact layer 17, a p-electrode 19 of AuZn connected to the buffer layer 12, a $p^+$ type conductive region 110 provided on the stopper layer 115, an anti-reflection cating film 111 of SiN provided on the reverse surface of the semiconductor substrate 11, and a passivation layer 112.

In fabrication, the layers 12, 13, 14, 15 115, 16 and 17 are grown in order by gas source MBE (Molecular Beam Epitaxy) method. The InP etching stopper layer 115 may be omitted. The $p^+$ type conductive region 110 is formed by Zn selective thermal diffusion using a round shape SiN layer having a diameter of 30 μm as a mask so as to have a carrier concentration of $11\times10^{18} cm^{-3}$ to $1\times10^{19} cm^{-3}$ (thereby resulting in a resistance lower than 10 ohms/cm³). The $p^+$ type of conductive region 110 is diffused a depth below the InP field buffer layer 14. The InP cap layer 16 and InGaAs contact layer 17 are etched at the boundary with the $p^+$ type conductive region 110 to the etching stopper layer 115 so as to remove the boundary region and to have a ring shape having a width of several μm. The entire structure is etched to the buffer layer 12 to have a mesa shape. The reverse surface of the substrate 11 is polished and the anti-reflection coating film 111 is formed thereon.

Figure 5:
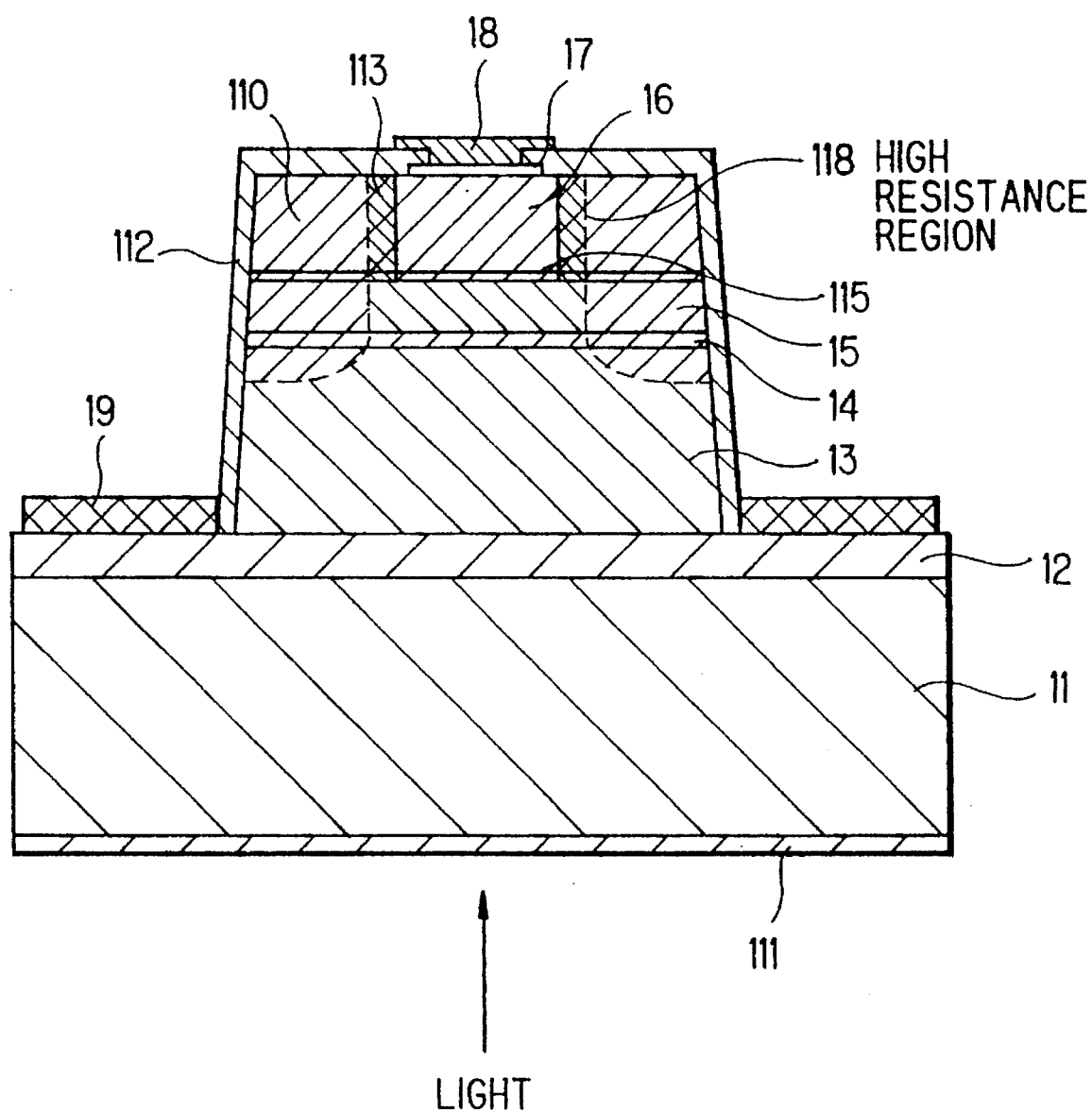
FIG. 5 is a cross-sectional view showing a semiconductor light receiving device of a second preferred embodiment according to the invention.

FIG. 5 shows a superlattice avalanche photodiode of a second preferred embodiment according to the invention, which includes a $p^+$ type InP substrate 11, a $p^+$ type InP buffer layer 12 provided on the InP substrate 11 and having a thickness of 0.5 to 1.0 μm, a $p^-$ type InGaAs light absorption layer 13 provided on the buffer layer 12 and having a carrier concentration of up to $2\times10^{15} cm^{-3}$ and a thickness of 1.0 to 1.5 μm, a $p^+$ type InP electric-field buffer layer 14 provided on the light absorption layer 13 and having a carrier concentration of 0.5 to $1\times10^{18} cm^{-3}$ and a thickness of 0.1 to 0.5 μm (depending on the carrier concentration of the field buffer layer 14), a non-doped i-type or n-type InAlGaAs/InAlAs superlattice multiplication layer 15 provided on the field buffer layer 14 having a carrier concentration of up to $2\times10^{15} cm^{-3}$ and a thickness of 0.23 μm, an InP etching stopper layer 115 provided on the superlattice multiplication layer 15 and having a thickness of 0.005 to 0.05 μm, an $n^+$ type of InAlAs (or InP) cap layer 16 provided on the stopper layer 115 to have a carrier concentration of up to $1\times10^{18} cm^{-3}$ and a thickness of 0.5 μm, an $n^+$ type InGaAs contact layer 17 provided on the cap layer 16 and having a carrier concentration of up to $1\times10^{19} cm^{-3}$ and having a thickness of 0.1 μm, an n-electrode 18 of AuGeNi connected to the contact layer 17, a p-electrode 19 AuZn connected to the buffer layer 12, a $p^+$ type conductive region 110 provided on the stopper layer 115, an anti-reflection coating film 111 of SiN provided on the reverse surface of the semiconductor substrate 11, and a passivation layer 112.

In fabrication, the layers 12, 13, 14, 15 115, 16 and 17 are grown in order by gas source MBE (Molecular Beam Epitaxy) method. The InP etching stopper layer 115 may be omitted. The $p^+$ type conductive region 110 is formed by Zn selective thermal diffusion using a round shape SiN layer having a diameter of 30 μm as a mask so as to have a carrier concentration of $1\times10^{18} cm^{-3}$ to $1\times10^{19} cm^{-3}$. The $p^+$ type dopant of conductive region 110 is diffused to depth below the InP field buffer layer 14, usually to the buffer layer 12. The InP cap layer 16 and InGaAs contact layer 17 are etched at the boundary with the $p^+$ type conductive region 110 to the etching stopper layer 115 so as to remove the boundary and region have a shape having a width of several μm. In the ring shape portion, a high resistance region 113 for electrically isolating the cap layer and selective region is formed by ion implantation of $O^+$, $H^+$, $Ar^+$, $Fe^{30}$, Ti or Co to have a resistance greater than 10,000 ohms/cm³ and to reach the superlattice multiplication layer 15. After the ion implantation, the entire structure may be annealed to activate it. After that, the entire structure is etched to the buffer layer 12 so as to have a mesa shape. The reverse surface the substrate 11 is polished and the reflection preventing layer 111 is formed thereon.

Figure 6:
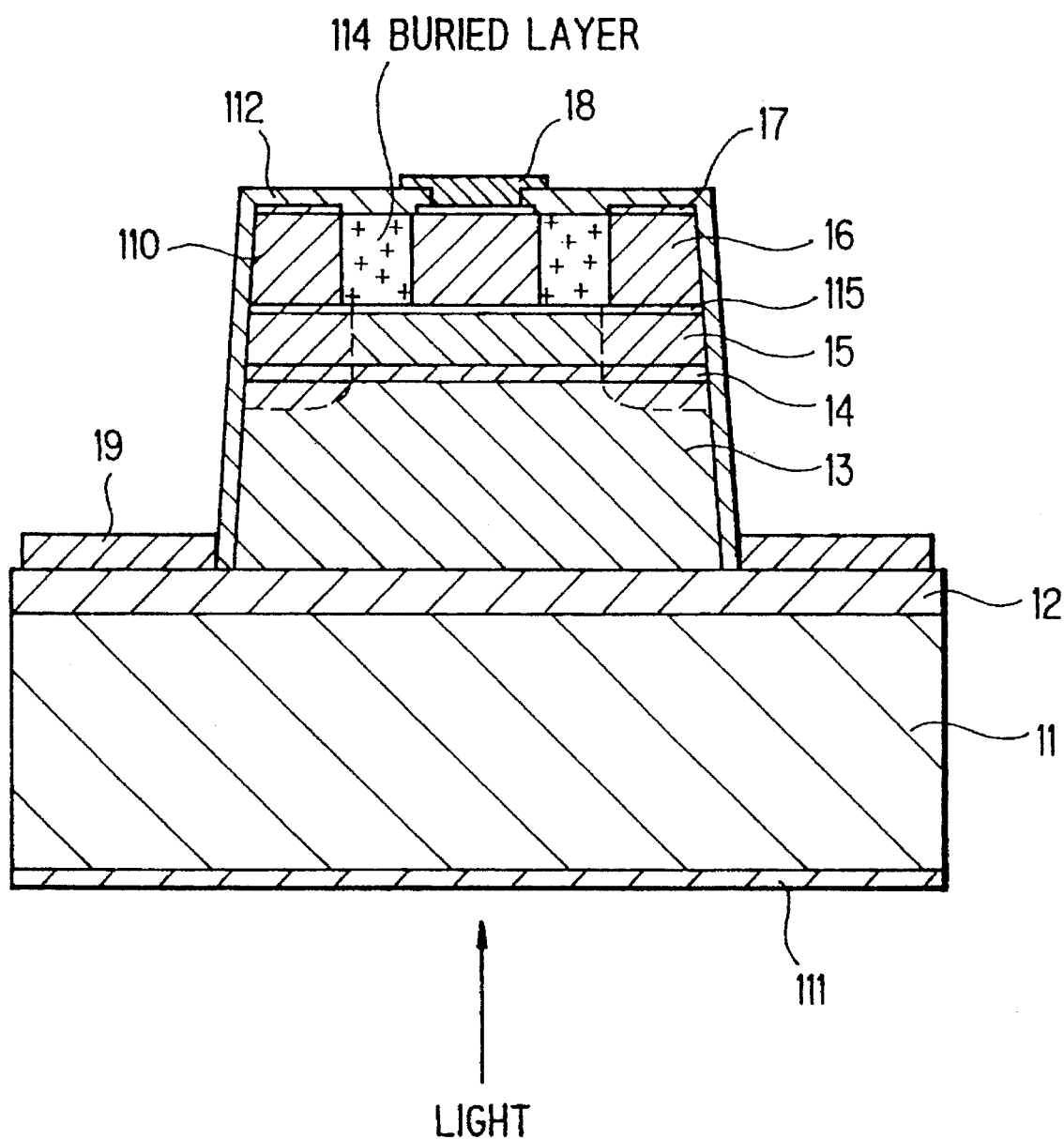
FIG. 6 is a cross-sectional view showing a semiconductor light receiving device of a third preferred embodiment according to the invention.

FIG. 6 shows a superlattice avalanche photodiode of a third preferred embodiment: according to the invention, which includes a $p^+$ type InP substrate 11, a $p^+$ type InP buffer layer 12 provided on the InP substrate 11 and having a thickness of 0.5 to 1.0 μm, a $p^+$ type InGaAs light absorption layer 13 provided on the buffer layer 12 and having a carrier concentration of up to $2\times10^{15} cm^{-3}$ and a thickness of 1.0 to 1.5 μm, a $p^+$ type InP electric-field buffer layer 14 provided on the light absorption layer 13 and having a carrier concentration of 0.5 to $1\times10^{18} cm^{-3}$ and a thickness of 0.1 to 0.05 μm (depending on the carrier concentration of the field buffer layer 14), a non-doped i-type or n-type InAlGaAs/InAlAs superlattice multiplication layer 15 provided on the field buffer layer 14 having a carrier concentration of up to $2\times10^{15} cm^{-3}$ and a thickness of 0.23 μm, an InP etching stopper layer 115 provided on the superlattice multiplication layer 15 and having a thickness of 0.005 to 0.05 μm, an $n^+$ type InAlAs cap layer 16 provided on the stopper layer 115 and having a carrier concentration of up to $1\times10^{18} cm^{-3}$ and a thickness of 0.5 m, an $n^+$ type InGaAs contact layer 17 provided on the cap layer 16 and having a carrier concentration of up to $1\times10^{19} cm^{-3}$ and a thickness of 0.1 μm an n-electrode 18 of AuGeNi connected to the contact layer 17, a p-electrode 19 of AuZn connected to the buffer layer 12, a $p^-$ type conductive region 110 provided on the stopper layer 115, an anti-reflection coating film 111 of SiN provided on the reverse surface of the semiconductor substrate 11, and a passivation layer 112.

In fabrication, the layers 12, 13, 14, 15 115 16 and 17 are grown in order by gas source MBE (Molecular Beam Epitaxy) method. The InP etching stopper layer 115 may be omitted. The p$^+$ type of conductive region 110 is formed by Zn selective thermal diffusion using a round shape SiN layer having a diameter of 30 μm as a mask so as to have a carrier concentration $1\times10^{18}$cm$^{-3}$ to $1\times10^{-3}$. The p$^+$ type dopant of conductive region 110 is diffused to depth below the InP field buffer layer 14, usually to the buffer layer 12. The InP cap layer 16 and InGaAs contact layer 17 are etched at the boundary with the p$^+$ type conductive region 110 to the etching stopper layer 115 using an SiN or SiO$_2$ layer as a mask so as to remove the boundary region so as to have a ring shape having a width of several μm. After that, an InP semiconductor buried layer 114 is selectively re-grown in the etched region using the same mask. Before the re-growth, it is preferable to do thermal cleaning or removing of the surface oxide layer by using a hydrogen radical beam. The entire structure is etched to the buffer layer 12 so as to have a mesa shape. The reverse surface of the substrate 11 is polished and the reflection preventing layer 111 is formed thereon.

Figure 7:
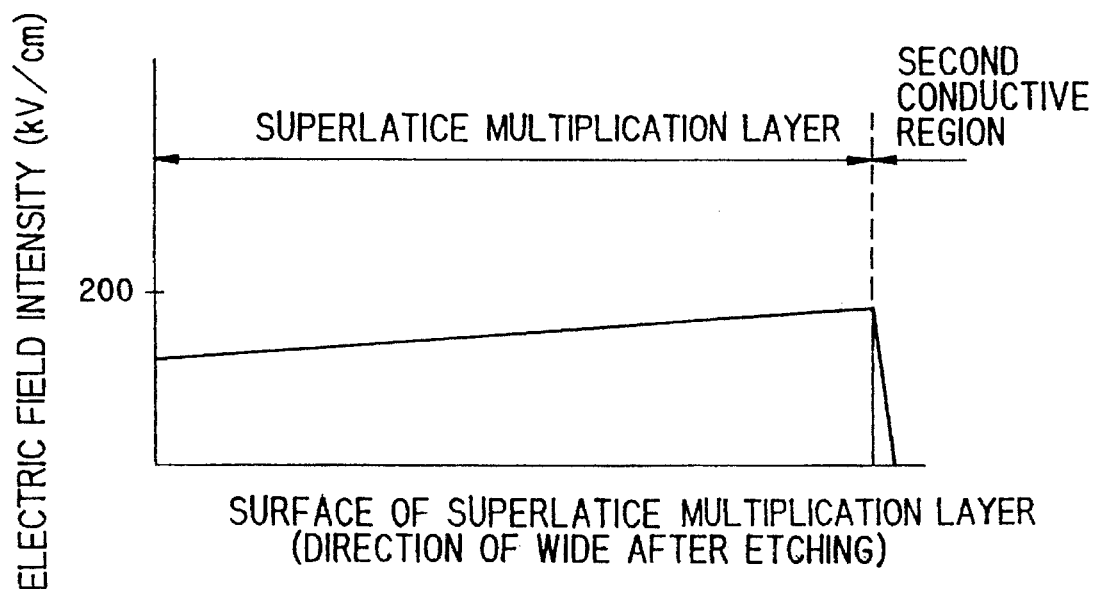
FIGS. 7 and 8 are graphs showing the operation of the first to third preferred embodiments.
Figure 8:
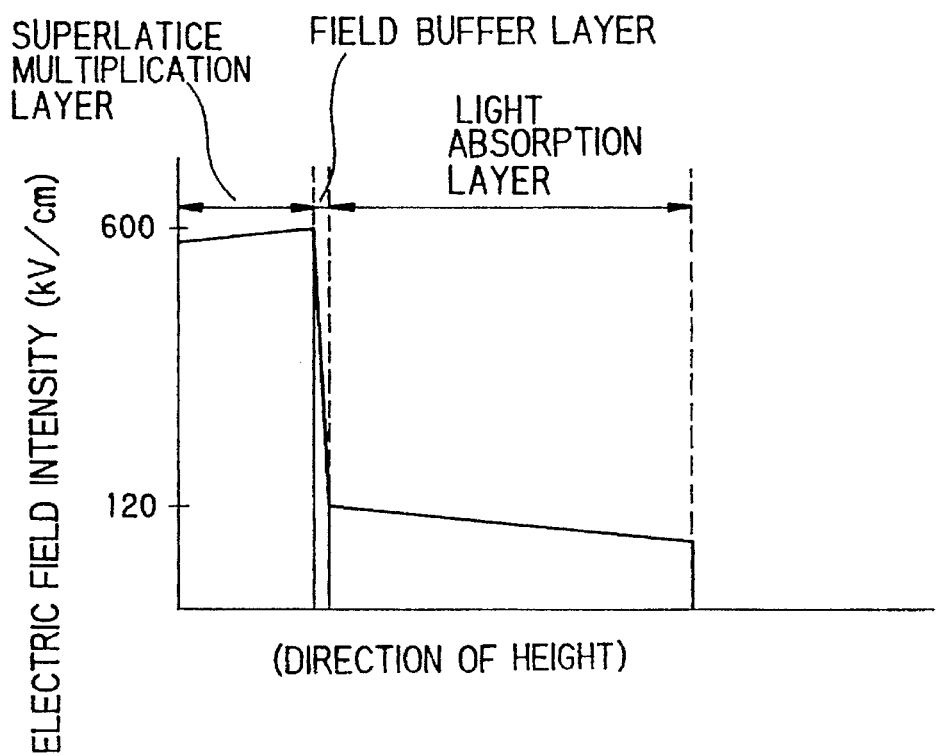

As shown in FIGS. 7 and 8, and according to the first to third preferred embodiments, only a region of the superlattice multiplication layer 15 just below the n$^+$ cap layer 16 has a high electric field of around 600 kV/cm, so that the boundary surface with the passivation layer does not have a higher electric field. Although a region being in contact with the passivation layer to which electric field is applied is the etching stopper layer 115 (or superlattice multiplication layer) at a space between the cap layer 16 and the region 110, electric field intensity is less than 300 kV/cm because of the space of several μm. Further, by the first to third preferred embodiments, 120 GHz of GB product can be obtained for high speed response, and initial dark current which is the same as that by conventional technology is detected. After a test of reliability, for example at 200° C. of atmospheric temperature with 100 μA of reverse current for 100 hours, the initial dark current was not increased and the device was not damaged.

Figure 9:
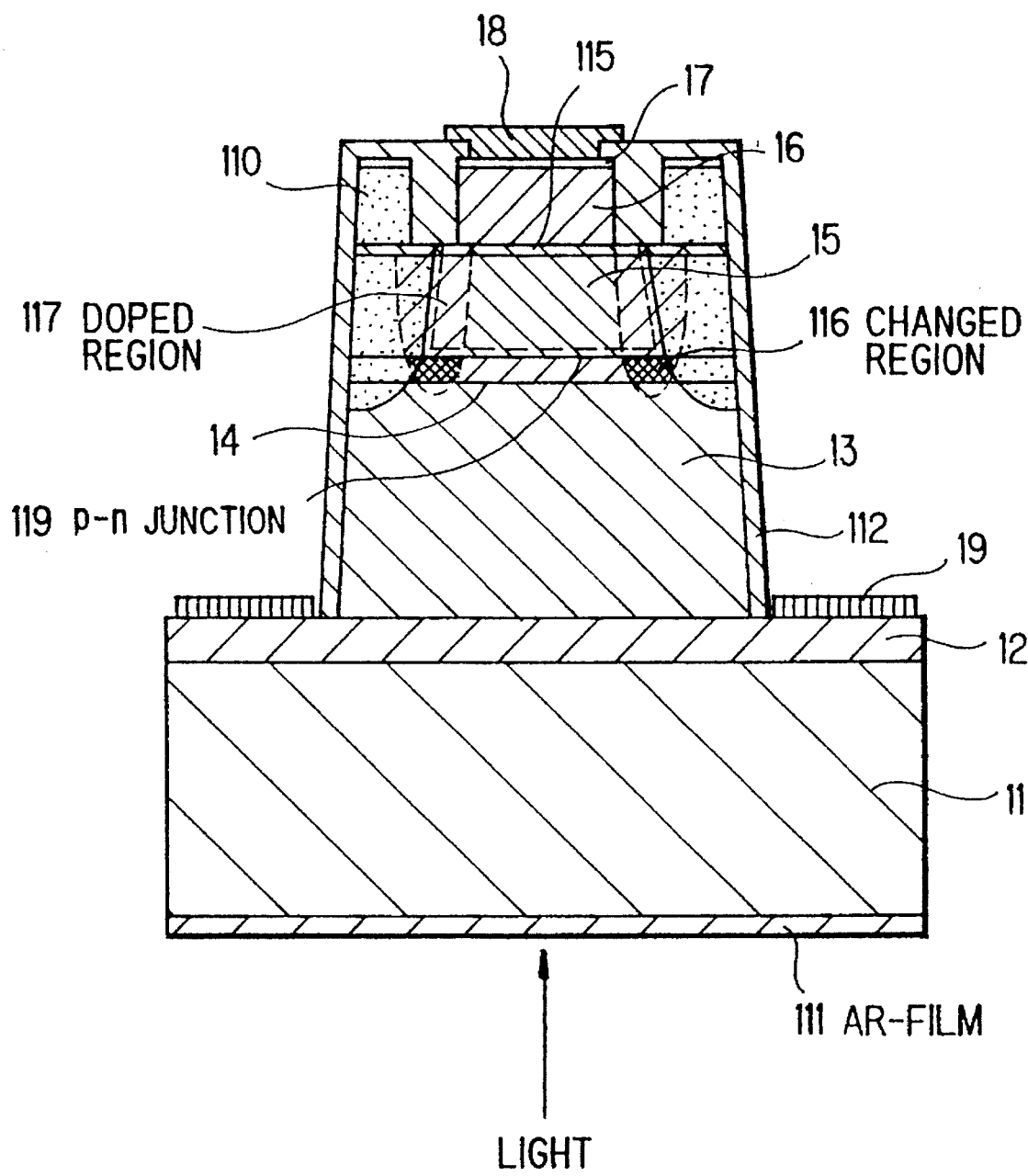
FIG. 9 is a cross-sectional view showing a semiconductor light receiving device of a fourth preferred embodiment according to the invention.

FIG. 9 shows a superlattice avalanche photodiode of a fourth preferred embodiment according to the invention, which includes a p$^+$ type InP substrate 11, a p$^+$ type InP buffer layer 12 provided on the InP substrate 11 and having a thickness of 0.5 to 1.0 μm, a p$^-$ type InGaAs light absorption layer 13 provided on the buffer layer 12 and having a carrier concentration of up to $2\times10^{15}$cm$^{-3}$ and a thickness of 1.0 to 1.5 μm, a p$^+$ type InP electric-field buffer layer 14 provided on the light absorption layer 13 and having a carrier concentration of 0.5 to $1\times10^{18}$cm$^{-3}$ and a thickness of 0.1 to 0.05 μm (depending on the carrier concentration of the field buffer layer 14), a non-doped i-type or n-type InAlGaAs/InAlAs superlattice multiplication layer 15 provided on the field buffer layer 14 having a carrier concentration of up to $2\times10^{15}$cm$^{-3}$ and a thickness of 0.23 μm, an InP etching stopper layer 115 provided on the superlattice multiplication layer 15 and having a thickness of 0.005 to 0.05 μm, an n$^+$ type InAlAs cap layer 16 provided on the stopper layer 115 and having a carrier concentration of up to $1\times10^{18}$cm$^{-3}$ and thickness of 0.5 μm, an n$^+$ type InGaAs contact layer 17 provided on the cap layer 16 and having a carrier concentration of up to $1\times10^{19}$cm$^{-3}$ and a thickness of 0.1 μm, an n-electrode 18 of AuGeNi connected to the contact layer 17, a p-electrode 19 of AuZn connected to the buffer layer 12, a p$^+$ type conductive region 110 provided on the stopper layer 115, an anti-reflection coating film 111 of SiN provided on the reverse surface of the semiconductor substrate 11, and a passivation layer 112.

In fabrication, the layers 12, 13, 14, 15 115, 16 and 17 are grown in order by gas source MBE (Molecular Beam Epitaxy) method. The InP etching stopper layer 115 may be omitted. Ion implantation and activation are selectively carried out in a ring shape with each of Fe, Ti, Co, H and O or a combination thereof using a round shape mask having an inner diameter of 20 μm and outer diameter of more than 30 μm. The ion implantation is carried out to at least deeper than the field buffer layer 14 so as to reduce the concentration of a region 116 in the buffer layer 14. Next, ion implantation region 117 is formed by Zn selective thermal diffusion using round shape SiN mask having a diameter of 30 μm so as to have a carrier concentration of about $1\times10^{19}$cm$^{-3}$. The region 117 is diffused to a depth below the InP field buffer layer 14. The InP cap layer 16 and InGaAs contact layer 17 are etched at the boundary with the p$^+$ type conductive region 110 so as to reach the surface of the superlattice multiplication layer 15 and so as to remove the boundary region so as to be in a ring shape having a width of several μm. After that, the entire structure is etched to the buffer layer 12 so as to have a mesa shape. The reverse surface of the substrate 11 is polished and the reflection preventing layer 111 is formed thereon.

Figure 10:
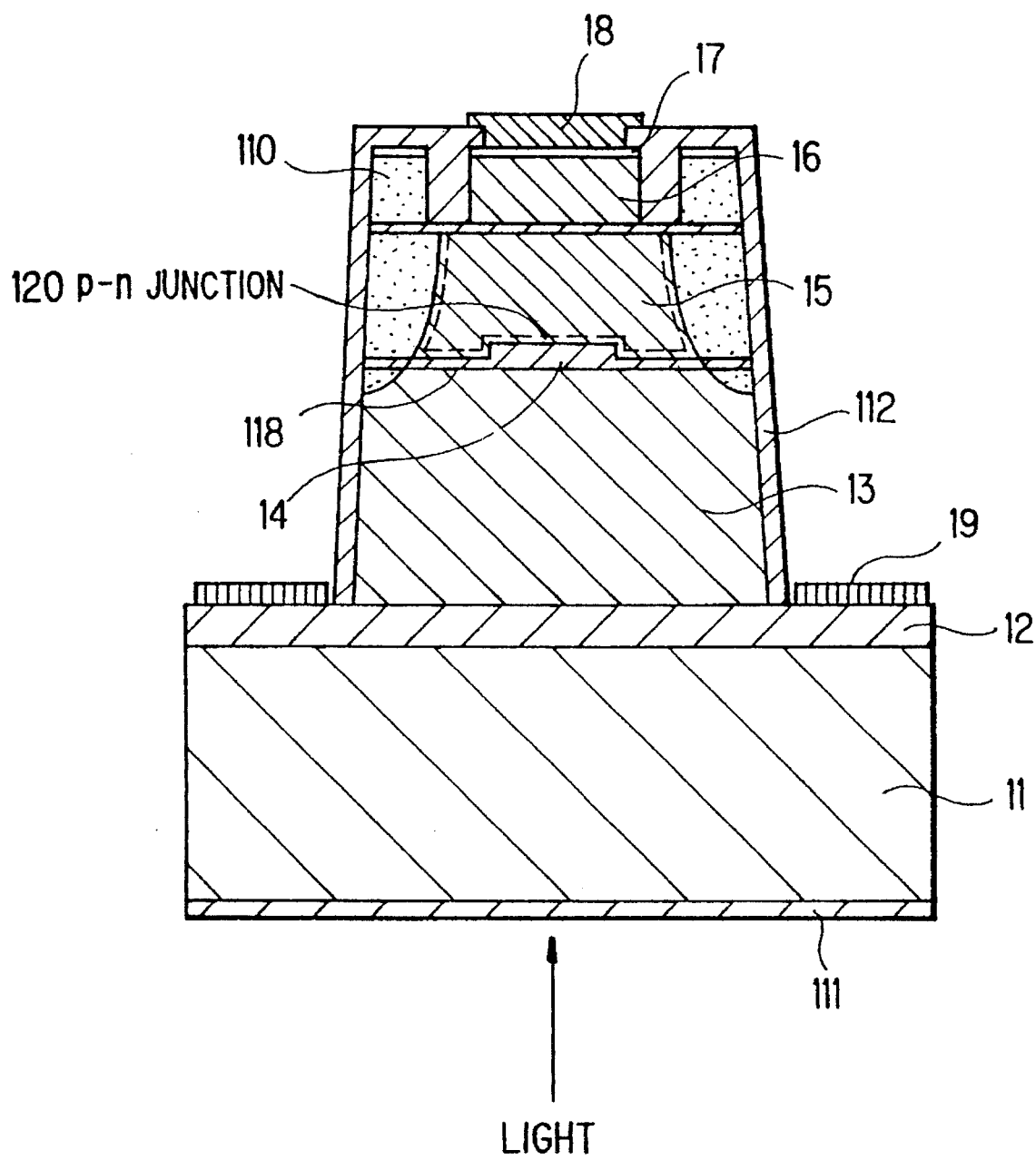
FIG. 10 is a cross-sectional view showing a semiconductor light receiving device of a fifth preferred embodiment according to the invention.

FIG. 10 shows a superlattice avalanche photodiode of a fifth preferred embodiment according to the invention, which includes a p$^+$ type InP substrate 11, a p$^+$ type InP buffer layer 12 provided on the InP substrate 11 and having a thickness of 0.5 to 1.0 μm, a p$^+$ type InGaAs light absorption layer 13 provided on the buffer layer 12 and having a carrier concentration of up to $2\times10^{15}$cm$^{-3}$ and a thickness of 1.0 to 1.5 μm, a p$^+$ type InP electric-field buffer layer 14 provided on the light absorption layer 13 and having a carrier concentration of 0.5 to $1\times10^{18}$cm$^{-3}$ and a thickness of 0.1 to 0.05 μm (depending on the carrier concentration of the field buffer layer 14), a non-doped i-type or n-type InAlGaAs/InAlAs superlattice multiplication layer 15 provided on the field buffer layer 14 having a carrier concentration of up to $2\times10^{15}$cm$^{-3}$ to have a thickness of 0.23 μm, an InP etching stopper layer 115 provided on the superlattice multiplication layer 15 and having a thickness of 0.005 to 0.05 μm, an n$^+$ type InAlAs cap layer 16 provided on the stopper layer 115 and having a carrier concentration of up to $1\times10^{18}$cm$^{-3}$ and a thickness of 0.5 μm, an n$^+$ type InGaAs contact layer 17 provided on the cap layer 16 and having a carrier concentration of up to $1\times10^{19}$cm$^{-3}$ and a thickness of 0.1 μm, an n-electrode 18 of AuGeNi connected to the contact layer 17, a p-electrode 19 of AuZn connected to the buffer layer 12, a p$^-$ type conductive region 110 provided on the stopper layer 115, an anti-reflection coating film 111 of SiN provided on the reverse surface of the semiconductor substrate 11, and a passivation layer 112.

In fabrication, the layers 12 to 14 are crystal-grown on the substrate 11, then, an outer region 118 of the InP field buffer layer 14 other than the round shaped inner region having a diameter of 20 μm is etched by 0.005 to 0.05 μm depending on the carrier concentration of the field buffer layer 14 itself. After that the layers 15 to 17 are gown in order by gas source MBE (Molecular Beam Epitaxy) method, MOVPE method, etc. The p$^+$ type conductive region is formed by Zn selective thermal diffusion using a round shape SiN mask having a diameter of 30 μm so as to have a carrier concentration of about $1\times10^{19}$cm$^{-3}$. The region is diffused to a depth below the InP field buffer layer 14, usually to the buffer layer 12. The InP cap layer 16 and InGaAs contact layer 17 are etched at the boundary with the p$^+$ type conductive region 110 so as to reach the surface of the superlattice multiplication layer 15 so as to remove the boundary region so as to have a ring shape having a width of several μm. After that, the entire structure is etched to the buffer layer 12 so as to have a mesa shape. The reverse surface of the substrate 11 is polished and the reflection preventing layer 111 is formed thereon.

In these embodiments, a semi-insulation InP substrate can be used instead of the p type of semiconductor substrate 11. The substrate may have height difference on its surface to use characteristics of impurity concentration change and/or a thickness change on the patterned substrate in semiconductor crystal growth.

Figure 11:
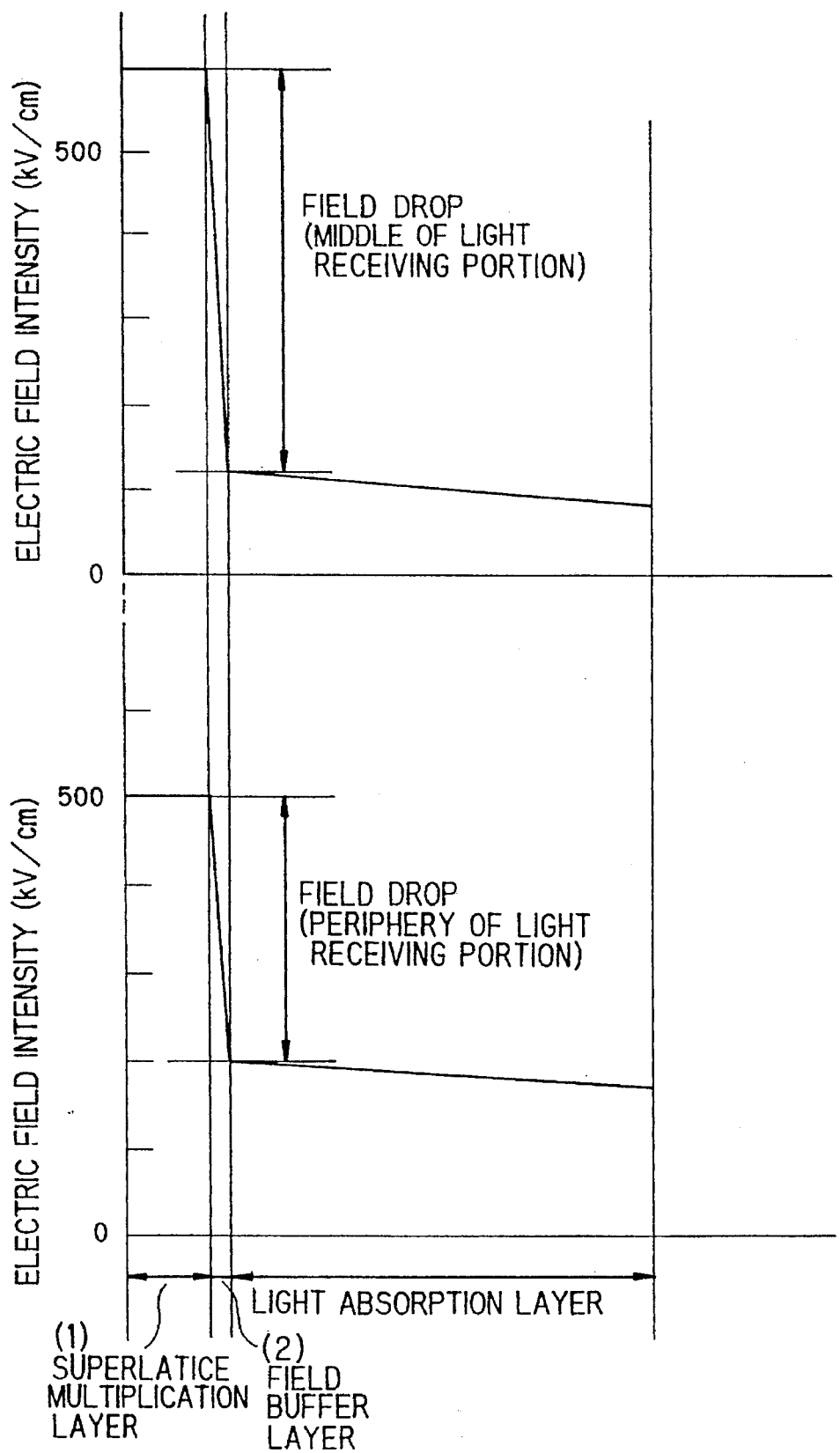
FIG. 11 is a graph showing the operation of the fourth and fifth preferred embodiments.
Figure 4:
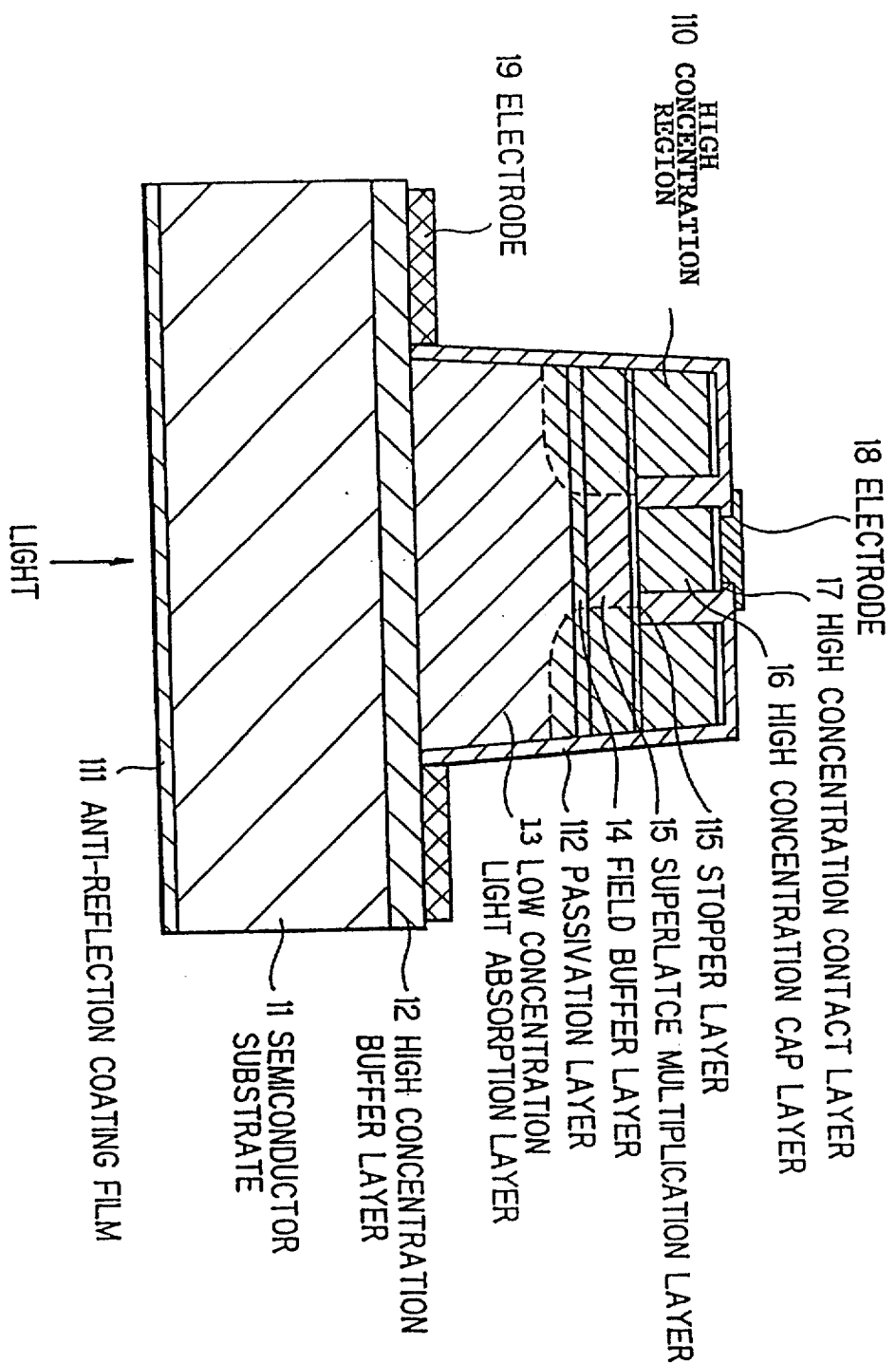

As shown in FIG. 11, according to the fourth and fifth preferred embodiments, the peripheral region around the cap layer has a smaller amount of electric-field drop relative to the portion just below the cap layer 16 so that electric field intensity around the superlattice 77 multiplication layer 15 is low whereby little edge multiplication can be realized. For reducing field drop, impurity implantation or diffusion is used. The impurity can be Fe, Ti, Co, H, O, etc. and forms a high resistance layer by itself. If the first conducive type of field buffer layer has a thickness which is thinner at the peripheral to have a smaller amount of field drop, the superlattice multiplication layer has lower electric field intensity at the peripheral relative to the center in response to the same bias voltage. These two embodiments have an advantage in uniformity of increase characteristics especially in a bias of more than ten multiplication factor.

Although the invention has been described with respect to specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A superlattice avalanche photodiode, comprising:

a first conductive type of semiconductor substrate;

a first conductive type of semiconductor buffer layer provided on the semiconductor substrate;

a first conductive type of semiconductor light absorption layer provided on the semiconductor buffer layer;

a first conductive type of semiconductor electric-field buffer layer formed on the semiconductor light absorption layer;

a superlattice multiplication layer provided on the semiconductor electric-field buffer layer;

a second conductive type of semiconductor cap layer provided on the superlattice multiplication layer;

a second conductive type of semiconductor contact layer provided on the semiconductor cap layer; and a first conductive type of selective region selectively formed, around a region receiving light, inwardly from the surface of the contact layer so as to reach at least under the electric-field buffer layer;

wherein the selective region is formed so as to be separated from either the semiconductor cap layer and contact layer by an etched region.

2. The superlattice avalanche photodiode according to claim 1, wherein:

said first conductive type of semiconductor substrate is of a high concentration type;

said first conductive type of semiconductor buffer layer is of a high concentration type;

said first conductive type of semiconductor light absorption layer is of low concentration type;

said second conductive type of semiconductor cap layer is of a high concentration type; and said second conductive type of semiconductor contact layer is of a high concentration type.

3. The superlattice avalanche photodiode, according to claim 1, further comprising:

a semiconductor buried region selectively formed in the etched region between the selective region and the semiconductor cap layer and contact layer.

4. The superlattice avalanche photodiode, according to claim 1, further comprising:

an etching stopper layer provided between the semiconductor cap layer and the superlattice multiplication layer.

5. The superlattice avalanche photodiode, according to claim 1, wherein:

said semiconductor electric field buffer layer is formed so that an electric field intensity has a smaller drop at a periphery of the region receiving light than inside the region receiving light.

6. The superlattice avalanche photodiode, according to claim 1, wherein:

said electric field buffer layer is formed to have a lower concentration of first conductive type below the etched region.

7. The superlattice avalanche photodiode, according to claim 1, wherein:

said electric field buffer layer is formed to have a thickness which is thicker in the region receiving light relative to its peripheral.

8. The superlattice avalanche photodiode, according to claim 1, wherein:

said substrate is of one selected from semi-insulated InP and a p-type of InP semiconductor;

said buffer layer is of one selected from $p^+$ type of InP and $p^+$ type of InAlAs;

said semiconductor light absorption layer is of $p^-$ type of InGaAs;

said semiconductor electric-field buffer layer is of $p^+$ type of InP;

said superlattice multiplication layer is of one selected from InAlAs/InAlGaAs superlattice, InAlAs/InAlGaAsP superlattice, and InAlAs/InGaAs superlattice;

said semiconductor cap layer is of one selected from InAlAs and InP; and said semiconductor contact layer is of one selected from InGaAs, InGaAsP and InAlGaAs.

9. The superlattice avalanche photodiode, according to claim 8, further comprises:

an InP etching stopper layer between the semiconductor cap layer and the superlattice multiplication layer.

10. A superlattice avalanche photodiode, comprising:

a first conductive type of semiconductor substrate;

a first conductive type of semiconductor buffer layer provided on the semiconductor substrate;

a first conductive type of semiconductor light absorption layer provided on the semiconductor buffer layer;

a first conductive type of semiconductor electric-field buffer layer formed on the semiconductor light absorption layer;

a superlattice multiplication layer of different conductive type from said first conductive type provided on the semiconductor electric-field buffer layer;

a second conductive type of semiconductor cap layer provided on the superlattice multiplication layer;

a second conductive type of semiconductor contact layer provided on the semiconductor cap layer; and a first conductive type of selective region selectively formed, around a region receiving light, inwardly from the surface of the contact layer so as to reach at least under the electric-field buffer layer;

wherein the selective region is formed so as to have higher resistance than at least a remainder of said selective region selectively at a region being in contact with the semiconductor cap layer and contact layer so as to electrically isolate said cap layer and selective region from each other by said higher resistance region.

11. The superlattice avalanche photodiode, according to claim 10, wherein:

said electric field buffer layer is formed to have a lower concentration of first conductive type below an etched region.

12. The superlattice avalanche photodiode, according to claim 10, wherein;

said electric field buffer layer is formed to have a thickness which is thicker in the region receiving light relative to its peripheral.

13. The superlattice avalanche photodiode, according to claim 1, further comprising;

a semiconductor buried region selectively formed in the etched region between the selective region and the semiconductor cap layer and contact layer, wherein said electric field buffer layer is formed to have a lower concentration of first conductive type below the etched region.

14. The superlattice avalanche photodiode, according to claim 1, further comprising;

a semiconductor buried region selectively formed in the etched region between the selective region and the semiconductor cap layer and contact layer, wherein said electric field buffer layer is formed to have a thickness which is thicker in the region receiving light relative to its peripheral.

15. The superlattice avalanche photodiode, according to claim 10, wherein said higher resistance region has resistance that is greater than 10,000 ohms/cm$^3$, and said cap layer and selective region each have a resistance less than 10 ohms/cm$^3$.

* * * * *

UNITED STATES PATENT AND TRADEMARK OFFICE
CERTIFICATE OF CORRECTION

PATENT NO. : 5,552,629
DATED : September 3, 1996
INVENTOR(S) : Isao Watanabe

It is certified that error appears in the above-indentified patent and that said Letters Patent is hereby corrected as shown below:

Title page, in the Title, Item [54], "AVALANCE" should be --AVALANCHE--.

Column 1, line 1, "AVALANCE" should be --AVALANCHE--.

Signed and Sealed this

Third Day of December, 1996

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,552,629
DATED : September 3, 1996
INVENTOR(S) : Isao WATANABE

It is certified that error appears in the above-identified patent and that said Letters Patent is hereby corrected as shown below:

In Fig. 4 on the patent cover page, and on Sheet 4 of the drawings, change "legend 110 selective region with high carrier concentration" to --110 high concentration region, as shown on the attached page.

Column 3, line 27, change "light" to --region--.

Column 6, line 30, after "shape" insert --boundary--.

Column 8, line 5, after "shape" insert --117--.

Column 8, line 10, change "ion" to --the--.

Column 8, line 11, delete "implantation" and change "117" to --110--.

Column 8, line 14, change "117" to --110--.

Signed and Sealed this

Fourth Day of May, 1999

Attest:

Q. TODD DICKINSON

*Attesting Officer*

*Acting Commissioner of Patents and Trademarks*

UNITED STATES PATENT AND TRADEMARK OFFICE
CERTIFICATE OF CORRECTION

PATENT NO.    : 5,552,629
DATED         : September 3, 1996
INVENTOR(S)   : Isao Watanabe It is certified that error appears in the above-identified patent and that said Letters Patent is hereby corrected as shown below:

Title page,
Item [54], Title, "AVALANCE" should be -- AVALANCHE --.

Drawings,
Sheet 4, Fig. 4, change "legend 110 selective region with high carrier concentration" to -- 110 high concentration region --.

Column 3,
Line 27, change "light" to -- region --.

Column 6,
Line 30, after "shape" insert -- boundary --.

Column 8,
Line 5, after "shape" insert -- 117 --.
Line 10, change "ion" to -- the --.
Line 11, delete "implantation" and change "117" to -- 110 --.
Line 14, change "117" to -- 110 --.

Signed and Sealed this

Sixth Day of August, 2002

Attest:

JAMES E. ROGAN
Attesting Officer    Director of the United States Patent and Trademark Office